(12) United States Patent
Klein et al.

(10) Patent No.: US 11,725,934 B2
(45) Date of Patent: Aug. 15, 2023

(54) SYSTEMS AND METHODS FOR METROLOGY OPTIMIZATION BASED ON METROLOGY LANDSCAPES

(71) Applicant: KLA Corporation, Milpitas, CA (US)

(72) Inventors: Dana Klein, Haifa (IL); Tal Marciano, Yokneam Illit (IL); Noa Armon, R.D. Misgav (IL)

(*) Notice: Subject to any disclaimer, the term of this patent is extended or adjusted under 35 U.S.C. 154(b) by 469 days.

(21) Appl. No.: 16/964,748

(22) PCT Filed: Jun. 25, 2020

(86) PCT No.: PCT/US2020/039476
§ 371 (c)(1),
(2) Date: Jul. 24, 2020

(87) PCT Pub. No.: WO2021/107986
PCT Pub. Date: Jun. 3, 2021

(65) Prior Publication Data
US 2022/0364855 A1    Nov. 17, 2022

Related U.S. Application Data

(60) Provisional application No. 62/941,726, filed on Nov. 28, 2019.

(51) Int. Cl.
*G01B 11/27* (2006.01)
*H01L 21/67* (2006.01)
*H01L 21/66* (2006.01)

(52) U.S. Cl.
CPC ........ *G01B 11/27* (2013.01); *H01L 21/67288* (2013.01); *H01L 22/12* (2013.01)

(58) Field of Classification Search
CPC ... H01L 21/67288; H01L 22/12; H01L 22/20; G01B 11/27; G03F 7/70616; G03F 7/70625
See application file for complete search history.

(56) References Cited

U.S. PATENT DOCUMENTS

| 7,502,715 | B1 | 3/2009 | Middlebrooks |
| 2016/0313658 | A1 | 10/2016 | Marciano et al. |
| 2017/0160074 | A1 | 6/2017 | Mossavat et al. |
| 2019/0074227 | A1 | 3/2019 | Peled et al. |
| 2019/0252270 | A1 | 8/2019 | Hoo et al. |
| 2020/0241428 | A1* | 7/2020 | Marciano ............... G06F 17/18 |

OTHER PUBLICATIONS

WIPO, ISR for International Application PCT/US2020/039476, dated Oct. 12, 2020.

* cited by examiner

*Primary Examiner* — Peter B Kim
(74) *Attorney, Agent, or Firm* — Hodgson Russ LLP (57) ABSTRACT

A method for quantifying sensitivity of metrology to process variation including performing metrology, by a metrology tool, on at least one metrology target located at at least one site on a semiconductor wafer, thereby generating a metrology landscape, and calculating a sensitivity metric directly based on the metrology landscape, the sensitivity metric quantifying a sensitivity of the metrology landscape to process variation involved in manufacture of the semiconductor wafer.

15 Claims, 9 Drawing Sheets

602 — ESTIMATE MISREGISTRATION VARIABILITY ACROSS WAVELENGTHS

604 — DECOMPOSE THE MISREGISTRATION VARIABILITY PER SITE ON WAFER INTO INDIVIDUAL SIGNATURES

606 — GROUP THE SIGNATURES AT LEAST INTO SIGNATURES CORRESPONDING TO SYSTEMATIC AND NON-SYSTEMATIC EFFECTS

608 — QUANTIFY THE IMPACT OF EACH SIGNATURE ON THE RAW MISREGISTRATION AND/OR A MODEL THEREOF AND/OR RESIDUALS THEREOF

610 — ASSOCIATE EACH SIGNATURE WITH THE PHYSICAL MEANING THEREOF AND CORRECT MISREGISTRATION MEASUREMENT OR RECIPE BASED THEREON.

FIG. 7

SYSTEMS AND METHODS FOR METROLOGY OPTIMIZATION BASED ON METROLOGY LANDSCAPES

REFERENCE TO RELATED APPLICATIONS

Reference is hereby made to U.S. Provisional Patent Application Ser. No. 62/941,726, filed Nov. 28, 2019, and entitled LANDSCAPE DECOMPOSITION FOR IDENTIFYING AND QUANTIFYING THE IMPACT OF PROCESS VARIATION AND NOISE WITHIN METROLOGY MEASUREMENT, the disclosure of which is hereby incorporated by reference and priority of which is hereby claimed.

FIELD OF THE INVENTION

The present invention relates generally to metrology and more particularly to misregistration measurements on semiconductor wafers.

BACKGROUND OF THE INVENTION

Various systems and methods for the measurement of misregistration in the manufacture of semiconductor wafers are known in the art.

SUMMARY OF THE INVENTION

The present invention seeks to provide novel systems and methods for optimization of metrology based on analysis of metrology landscapes, which analysis may include calculation of a sensitivity metric based on metrology landscapes and/or metrology landscape decomposition, in order to identify and reduce contributions to inaccuracies therein.

There is thus provided in accordance with a preferred embodiment of the present invention a method for quantifying sensitivity of metrology to process variation including performing metrology, by a metrology tool, on, at least one metrology target located at at least one site on a semiconductor wafer, thereby generating a metrology landscape, and calculating a sensitivity metric directly based on the metrology landscape, the sensitivity metric quantifying a sensitivity of the metrology landscape to process variation involved in manufacture of the semiconductor wafer.

In accordance with one preferred embodiment of the present invention, the performing metrology on at least one metrology target includes performing metrology on a plurality of metrology targets, the calculating a sensitivity metric includes calculating a sensitivity metric for each of the plurality of metrology targets, and the method also includes comparing the sensitivity metrics calculated for each of the plurality of metrology targets and selecting a selected metrology target of the plurality of metrology targets as an optimum metrology target having least sensitivity to the process variation in comparison to other ones of the plurality of metrology targets, based on a value of the sensitivity metric of the selected metrology target being lower than values of the sensitivity metric of the other ones of the plurality of metrology targets.

Further in accordance with one preferred embodiment of the present invention, the method also includes, following the selecting a selected metrology target, further performing metrology on the semiconductor wafer by the metrology tool, utilizing the selected metrology target, thereby generating an additional metrology landscape, decomposing the additional metrology landscape at least into components thereof arising from systematic and non-systematic errors therein, quantifying a contribution of at least one of the components to the additional metrology landscape, and correcting the additional metrology landscape by removing therefrom the contribution, as found by the quantifying.

Preferably, the method also includes correcting the metrology landscape for errors therein arising from the process variation, based on a value of the sensitivity metric.

Preferably, the performing metrology includes performing metrology over a multiplicity of wavelengths, the metrology landscape measuring variation of a metrology measurement as a function of the multiplicity of wavelengths.

Preferably, the metrology measurement includes measurement of misregistration between layers of the semiconductor wafer.

In accordance with another preferred embodiment of the present invention, the method also includes selecting an optimum wavelength of the multiplicity of wavelengths having least sensitivity to process variation in comparison to other wavelengths of the multiplicity of wavelengths, based on correlating values of the sensitivity metric to ones of the multiplicity of wavelengths, and further performing metrology on the semiconductor wafer by the metrology tool, utilizing the optimum wavelength.

In accordance with yet another preferred embodiment of the present invention, the method also includes performing the metrology under a plurality of conditions, calculating the sensitivity metric for each of the plurality of conditions and optimizing the performance of the metrology in accordance with a condition of the plurality of conditions having a lowest sensitivity metric value calculated therefor.

Preferably, the sensitivity metric is calculated in accordance with $$S_{metric} = \chi \cdot \sqrt{\frac{\sum_{i=1}^{N} w_i (MIS_i - <MIS>)^2}{\sum w_i}}$$

wherein $S_{metric}$ is the sensitivity metric, N is a number of the multiplicity of wavelengths over which a part of interest of the metrology landscape is measured, i is a wavelength index, $MIS_i$ is a misregistration measurement at wavelength i of the multiplicity of wavelengths N, $w_i$ is a wavelength weight, and <MIS> is a weighted average misregistration across the landscape, given by $$<MIS> = \frac{\sum w_i MIS_i}{\sum w_i}$$

and $\chi$ may take the value of +1 or −1.

There is additionally provided in accordance with another preferred embodiment of the present invention a system for quantifying sensitivity of metrology to process variation including a metrology tool operative to perform metrology on at least one metrology target located at at least one site on a semiconductor wafer, the metrology tool generating a metrology landscape, and a sensitivity metric calculator operative to receive the metrology landscape and to calculate a sensitivity metric directly based on the metrology landscape, the sensitivity metric quantifying a sensitivity of the metrology landscape to process variation involved in manufacture of the semiconductor wafer.

In accordance with a preferred embodiment of the system of the present invention, the metrology tool is operative to perform the metrology over a multiplicity of wavelengths, the metrology landscape measuring variation of a metrology measurement as a function of the multiplicity of wavelengths, and to select an optimum wavelength of the multiplicity of wavelengths having least sensitivity to process variation in comparison to other wavelengths of the multiplicity of wavelengths, based on correlating values of the sensitivity metric to ones of the multiplicity of wavelengths, the metrology tool being operative to perform additional metrology on the semiconductor wafer, utilizing the optimum wavelength, thereby generating an additional metrology landscape.

In accordance with another preferred embodiment of the system of the present invention, the metrology tool is operative to perform the metrology on a plurality of metrology targets and the sensitivity metric calculator is operative to calculate a sensitivity metric for each of the plurality of metrology targets, the sensitivity metric calculator being additionally operative to compare the sensitivity metrics calculated for each of the plurality of metrology targets and to select a selected metrology target of the plurality of metrology targets as an optimum metrology target having least sensitivity to the process variation in comparison to other ones of the plurality of metrology targets, based on a value of the sensitivity metric of the selected metrology target being lower than values of the sensitivity metric of the other ones of the plurality of metrology targets.

In accordance with yet another preferred embodiment of the system of the present invention the metrology tool is operative to perform the metrology under a plurality of conditions, and the sensitivity metric calculator is operative to calculate the sensitivity metric for each of the plurality of conditions, performance of the metrology being optimized in accordance with a condition of the plurality of conditions having a lowest sensitivity metric value calculated therefor.

Preferably, the sensitivity metric is calculated in accordance with $$S_{metric} = \chi \cdot \sqrt{\frac{\sum_{i=1}^{N} w_i (MIS_i - <MIS>)^2}{\sum w_i}}$$

wherein $S_{metric}$ is the sensitivity metric, N is a number of the multiplicity of wavelengths over which a part of interest of the metrology landscape is measured, i is a wavelength index, $MIS_i$ is a misregistration measurement at wavelength i of the multiplicity of wavelengths N, $w_i$, is a wavelength weight, and <MIS> is a weighted average misregistration across the landscape, given by $$<MIS> = \frac{\sum w_i MIS_i}{\sum w_i}$$

and $\chi$ may take the value of +1 or −1.

Preferably, the system also includes a landscape decomposer operative to decompose the additional metrology landscape at least into components thereof arising from systematic and non-systematic errors therein, quantify, a contribution of at least one of the components to the additional metrology landscape, and correct the additional metrology landscape by removing therefrom the contribution.

There is further provided in accordance with yet another preferred embodiment of the present invention a method for quantifying components of metrology, including decomposing a metrology landscape at least into components thereof arising from systematic and non-systematic errors therein, quantifying a contribution of at least one of the components to the metrology landscape, and correcting the metrology landscape by removing therefrom the contribution, as found by the quantifying.

Preferably, the decomposing is carried out by principle component analysis of the metrology landscape.

Preferably, the decomposing is performed on at least one of a raw inaccuracy level, a modeled inaccuracy level and a residual inaccuracy level.

In accordance with one preferred embodiment of the present invention, the method also includes, prior to the decomposing, performing metrology, by a metrology tool, on at least one metrology target located at at least one site on a semiconductor wafer, thereby generating the metrology landscape, and calculating a sensitivity metric directly based on the metrology landscape, the sensitivity metric quantifying a sensitivity of the metrology landscape to process variation involved in manufacture of the semiconductor wafer.

There is yet further provided in accordance with yet another preferred embodiment of the present invention a system for quantifying components of metrology, including a metrology tool operative to perform metrology on a semiconductor wafer and to output a metrology landscape, and a landscape decomposer operative to decompose the metrology landscape at least into components thereof arising from systematic and non-systematic errors, to quantify a contribution of at least one of the components to the metrology landscape and to correct the metrology landscape by removing therefrom the contribution.

Preferably, the landscape decomposer is operative to perform principle component analysis on the metrology landscape in order to decompose the metrology landscape into the components thereof.

Preferably, the landscape decomposer is operative to decompose the metrology landscape on at least one of a raw inaccuracy level, a modeled inaccuracy level and a residual inaccuracy level.

In accordance with one preferred embodiment of the present invention, the system also includes a sensitivity metric calculator operative to receive the metrology landscape and to calculate a sensitivity metric directly based on the metrology landscape, the sensitivity metric quantifying a sensitivity of the metrology landscape to process variation involved in manufacture of the semiconductor wafer.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
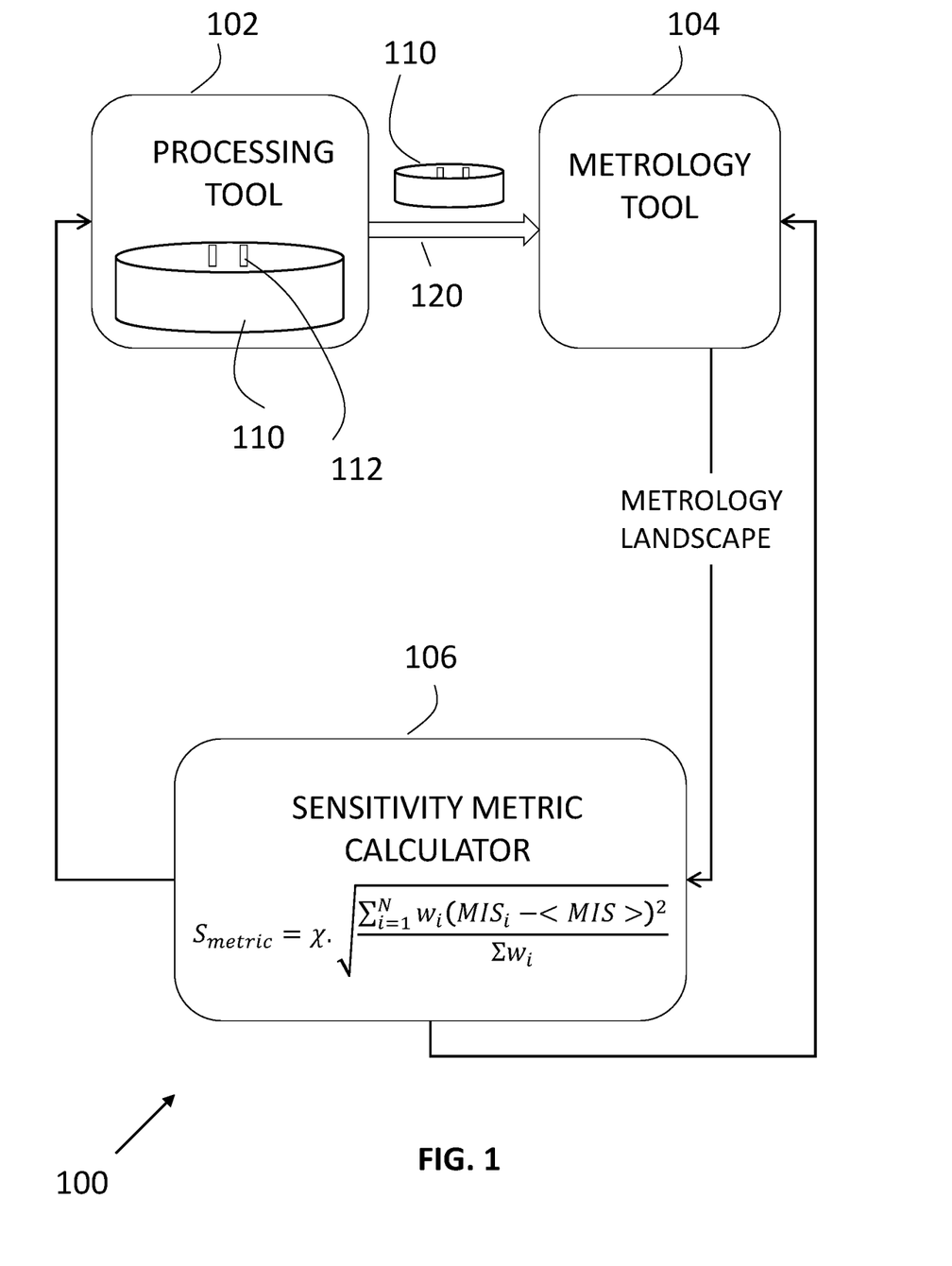
FIG. 1 is a simplified schematic illustration of components of a system for optimization of metrology based on analysis of metrology landscapes, constructed and operative in accordance with a preferred embodiment of the present invention.

Reference is now made to FIG. 1, which is a simplified schematic illustration of components of a system for optimization of metrology based on analysis of metrology landscapes, constructed and operative in accordance with a preferred embodiment of the present invention.

As seen in FIG. 1, there is provided a system 100 for metrology optimization preferably including a semiconductor processing tool 102, a metrology tool 104 and a sensitivity metric calculator 106, for calculating a metric quantifying a sensitivity of metrology performed by metrology tool 104 to process variations in the processing carried out by processing tool 102.

Processing tool 102 is preferably operative to process semiconductor wafers, an exemplary one of which semiconductor wafers 110 is shown here. Semiconductor wafer 110 may belong to a lot of semiconductor wafers, which lot may form part of a batch of semiconductor wafers processed by processing tool 102.

Processing tool 102 is preferably embodied as a lithographic patterning tool, such as a scanner. An example of a processing tool useful in the system of FIG. 1 is the ASML scanner 1950$i$, commercially available from ASML of Veldhoven, Netherlands. During processing, semiconductor wafers are preferably retained on a stage of processing tool 102, typically on two chucks thereon.

Metrology tool 104 is preferably embodied as a misregistration measurement tool, for measuring misregistration between layers of semiconductor wafer 110 produced by sequential processing steps carried out by processing tool 102. Metrology tool is particularly preferably operative to measure misregistration between targets located on layers of semiconductor wafer 110, misregistration between the targets being considered to be indicative of misregistration between the layers themselves upon which the targets are located. A metrology target 112 located on wafer 110 is shown in a highly schematic, representative manner in FIG. 1.

Metrology tool 104 is particularly preferably operative to output a metrology spectrum or landscape, recording the dependency of one or more metrology measurements, such as misregistration, on one of more metrology parameters, such as measurement wavelength. It is appreciated that although the metrology landscape output by metrology tool 104 is described henceforth as a misregistration landscape varying as a function of wavelength, this is illustrative only and other metrology landscapes charting metrology measurements other than misregistration as a function of metrology parameters other than wavelength are also possible and included in the scope of the present invention.

Metrology tool 104 may be any type of optical metrology tool, including an imaging type tool or a scatterometry type tool. An example of a metrology tool useful in the system of FIG. 1 is the Archer ATL100, commercially available from KLA of California, USA. Processing tool 102 and metrology tool 104 are preferably located at a common location such that semiconductor wafer 110 processed by processing tool 102 may be readily transferred to metrology tool 104 for the performance of metrology thereon. The physical transfer of semiconductor wafer 110 between processing tool 102 and metrology tool 104 is indicated in FIG. 1 by an arrow 120.

Processing of semiconductor wafer 110 by processing tool 102 typically may involve process variations, which process variations may cause inaccuracies in the in the metrology measurement signal output by metrology tool 104. Such process variations may be of a type termed asymmetric process variations. Asymmetric process variations may cause asymmetry in the metrology target 112 due, by way of example, to target deformation, tilting or noise. Such process variations may additionally or alternatively be of a type termed symmetric process variations. Symmetric process variations may cause fluctuations in the properties of wafer 110, such as fluctuations in the optical properties of the layers or layer thicknesses.

The asymmetry in the metrology signal due to asymmetric and/or symmetric process variations is in addition to the asymmetry in the metrology signal due to actual misregistration between layers of wafer 110. The overall signal output by metrology tool 104 thus is a sum of the actual misregistration between layers of wafer 110, which is the desired measurement of interest, and an inaccuracy component due to process variation, as well as other inaccuracy components due to noise arising from various sources. The measured misregistration may thus be expressed as $$\text{MIS}_{measured}(\lambda) = \epsilon + \delta N(\lambda) \quad (1)$$

where $\text{MIS}_{measured}(\lambda)$ is the measured misregistration as a function of the metrology wavelength $\lambda$, $\epsilon$ is the actual misregistration between the semiconductor layers and $\delta N(\lambda)$ is the wavelength dependent error component of the measured misregistration.

It is a purpose of the present invention in one aspect thereof to provide a novel metric, herein termed a sensitivity or S-metric, for quantifying the sensitivity of the metrology measurements, as measured by metrology tool 104, to process variation. In other words, the S-metric provides a measure of the value of the term $\delta N(\lambda)$ in equation (1) above. Based on such an S-metric, algorithms may be developed in order to automatically correct misregistration measurements for errors therein arising from process variation. Additionally or alternatively, the operation of metrology tool 104 and/or processing tool 102 may be optimized in order to minimize the value of the S-metric, as is further detailed henceforth. As a result, of one or both of these approaches, the accuracy of misregistration measurements may be improved.

The S-metric is preferably calculated directly based on the metrology landscape output by metrology tool 102. The S-metric preferably quantifies the sensitivity of at least part, and optionally all, of the metrology landscape measured by metrology tool 104 to process variation. The S-metric is preferably calculated in accordance with:

$$S_{metric} = \chi \cdot \sqrt{\frac{\sum_{i=1}^{N} w_i (MIS_i - <MIS>)^2}{\sum w_i}} \qquad (2)$$

wherein N is the number of wavelengths over which the part of interest of the metrology landscape is measured, i is the wavelength index, $MIS_i$ is a misregistration measurement at wavelength i of plurality of wavelengths N, $w_i$, is the wavelength weight, and <MIS> is the weighted average misregistration across the landscape, given by $$<MIS> = \frac{\sum w_i MIS_i}{\sum w_i} \qquad (3)$$

$\chi$ may take the value of +1 or −1, according the direction of resonance of the metrology signal, Inch may be found by calculating the sign of the difference between misregistration measured at resonance and misregistration measured far from resonance. Alternatively, $\chi$ may be removed from equation (1) and the absolute value of the S-metric found instead.

The wavelength weight $w_i$, may be defined based on one of a range of different possible quality metrics expressing the measurability the metrology measurement at wavelength i, for example measurement contrast in the case of imaging-based metrology or measurement sensitivity in the case of scatterometry-based metrology. The higher the quality metric, for example the greater the contrast at wavelength i, the greater the relative weighting to be assigned to measurements at that wavelength i. This is based on the understanding that greater weighting should be given to measurements taken with better measurability and lesser weighting should be given to measurements taken with poorer measurablity, since the poorer the measurability in a region of the metrology landscape, the greater the inaccuracy of measurements in that region.

The S-metric is preferably measured for a multiplicity of sites on the surface of wafer 110, for a given metrology target. An overall S-metric may then be found for a given wafer surface having a given metrology target thereon in accordance with $$\text{Wafer\_S}_{metric} = <\text{Site\_S}_{metric}>_s + 3 \ast \sigma_s(\text{Site\_S}_{metric}) \qquad (4)$$

wherein Wafer_$S_{metric}$ is the overall S-metric for the wafer, s is the measured site index, <Site_$S_{metric}$>$_s$ is the S-metric averaged over all measured sites, and $3\ast\sigma_s$(Site_$S_{metric}$) is the 3-sigma variation of the S-metric over all measured sites. It is appreciated that the Wafer_$S_{metric}$ is target design specific and is calculated for a given target design on the wafer. Furthermore, it is appreciated that the wafer S-metric is dependent on the configuration of the metrology tool 104 and thus is calculated for a given configuration of the metrology tool 104.

The S-metric is preferably automatically computed by sensitivity metric calculator module 106 based on the metrology landscape measured and output by metrology tool 104. It is appreciated that although sensitivity metric calculator module 106 is illustrated herein as a separate module, distinct from metrology tool 104, this is for the purpose of clarity of explanation and the functionality of sensitivity metric calculator module 106 may alternatively be fully or partially incorporated within metrology tool 104. Sensitivity metric calculator module 106 is preferably operative to provide feedback to one or both of processing tool 102 and metrology tool 104 based on the S-metric value or values calculated thereby, as is further detailed below.

Figure 2A:
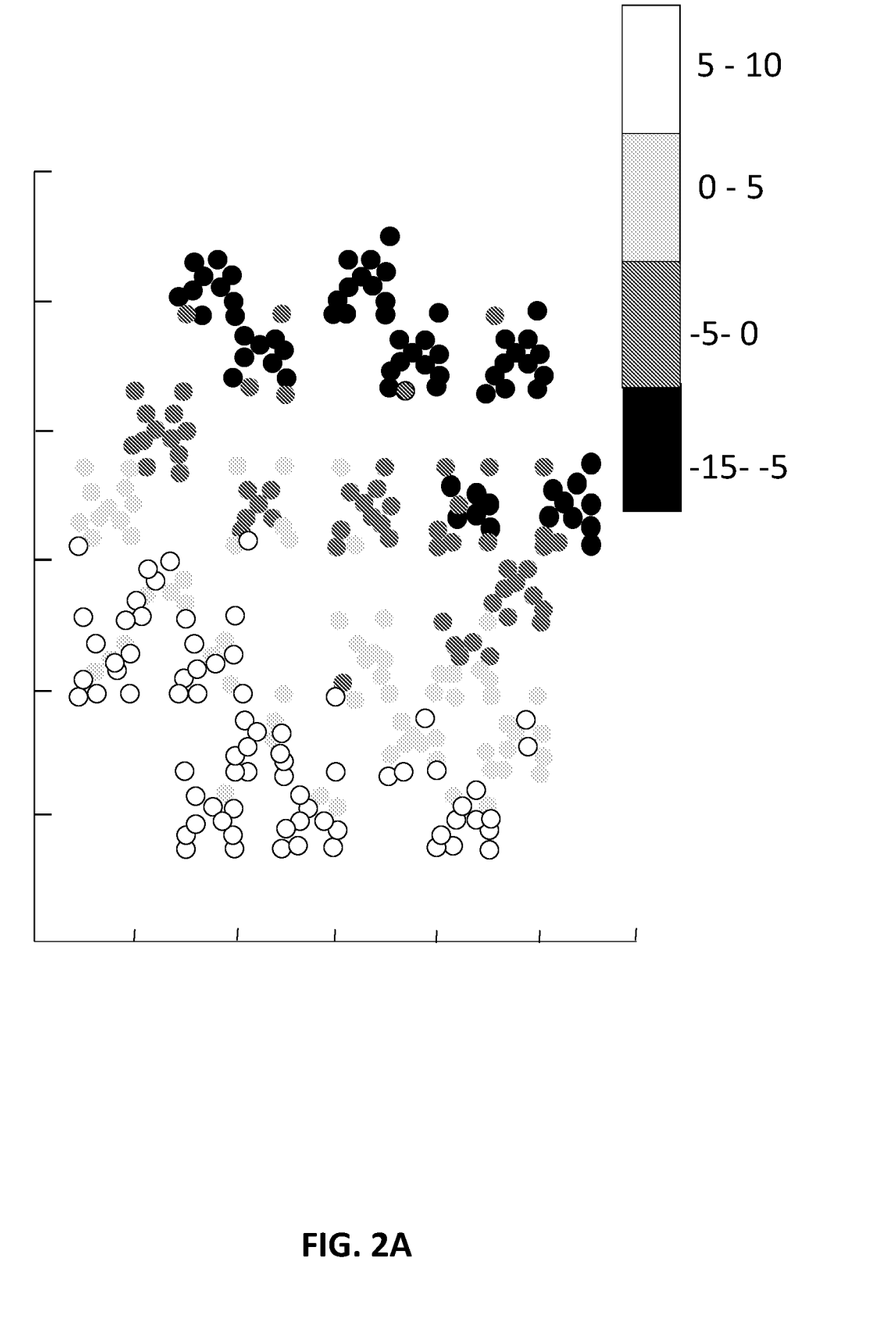
FIG. 2A is a simplified, graph showing data obtained from analysis of a metrology landscape as generated by a system of the type shown in FIG. 1.

An example of a distribution of the S-metric across a surface of wafer 110 for a given target 112 is shown in FIG. 2A. Turning now to FIG. 2A, the S-metric is seen to be calculated for a multiplicity of sites on wafer 110, each site being represented by a circle in the distribution across wafer 110 shown in FIG. 2A. Higher absolute values of the S-metric in FIG. 2A indicate greater sensitivity of the metrology landscape at these sites to process variation and lower absolute values of the S-metric indicate less sensitivity of the metrology landscape at these sites to process variation. Highest absolute S-metric values are seen at the top and bottom of wafer 110, indicating highest sensitivity to process variation in these regions of the wafer.

Figure 2B:
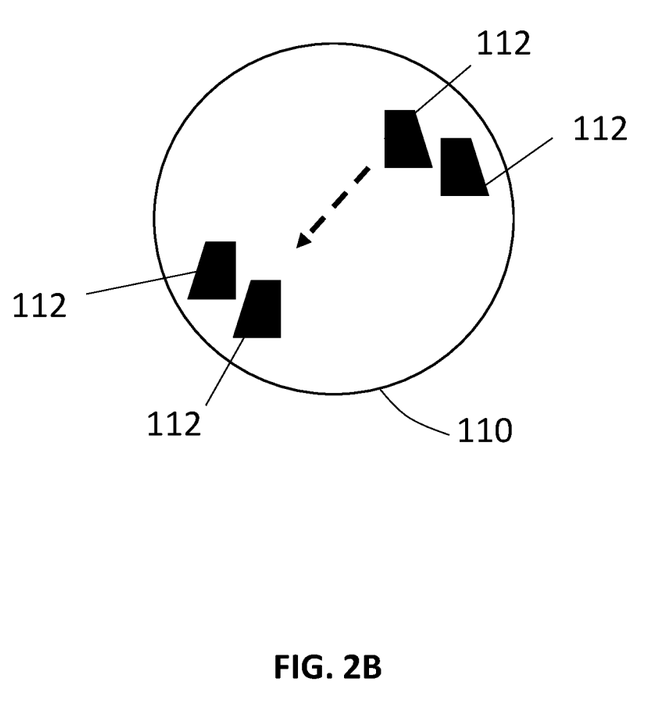
FIG. 2B is a simplified schematic diagram of target structures on a surface of a semiconductor wafer giving rise to data of the type shown in FIG. 2A.

The change in sign of the S-metric that is seen across the wafer, in the direction from the lower left hand side of the wafer to the upper right hand side of the wafer in FIG. 2A, is indicative of a change in asymmetry of target 112 on wafer 110. Such a change in target asymmetry is schematically shown in FIG. 2B. Referring now to FIG. 2B, target 112 is designed to be a symmetric target such as a bar-shaped target, but for process variations inducing asymmetry therein. The physical change in asymmetry of target 112 causes a corresponding change in sign of S-metric values calculated based thereon. Absolute S-metric values are seen to decrease towards the center of the wafer, indicating better target symmetry and improved accuracy of the metrology landscape in this region of the wafer.

It is appreciated that the S-metric, which is directly calculated based on the metrology landscape, thus provides a quantitative measure of the sensitivity of the metrology landscape or a portion thereof to process variation.

The S-metric values may be used in order to improve metrology accuracy in a number of ways, several of which are listed hereinbelow by way of example only. However, it is appreciated that other applications of the S-metric may be apparent to one skilled in the art and are included in the scope of the present invention.

In accordance with one possible embodiment of the present invention, a correlation may be found between the S-metric and misregistration at a specific wavelength. By way of example, such a correlation may be automatically found by computerized algorithms. A high correlation between the S-metric across the wafer and misregistration at a given measurement wavelength may indicate high sensitivity to process variation at the given wavelength, such that the given wavelength is less preferred for metrology. Conversely, a low correlation between the S-metric across the wafer and misregistration at an additional given measurement wavelength may indicate lower sensitivity to process variation at the additional given wavelength, such that the additional given wavelength is more preferred for metrology. The operating recipe of metrology tool 104 may then be adjusted, for example by way of feedback between S-metric calculator module 106 and metrology tool 104, such that metrology tool performs metrology in accordance with an operating regime having minimal sensitivity to process variation. For example, metrology tool 104 may be adjusted to perform metrology at a given wavelength having lowest correlation of the misregistration measured thereat to the S-metric value over the metrology landscape. The metrology wavelength recipe providing the greatest accuracy may be given by $\min(S_s - MIS_{i,s})$, where MIS is the misregistration measurement, i is the wavelength index and S is the S-metric for a given site s on wafer 110.

Additionally or alternatively, a scaling factor may be calculated based on the S-metric values in order to correct the misregistration measurements for inaccuracy therein due to process variations, for a given metrology recipe. Such a scaling factor may be calculated on a per site basis, based on the S-metric value for each site, or may be calculated on a per wafer basis, based on the S-metric value averaged over the wafer. Such scaling would preferably be based on an additional internal or external reference, used to quantify the inaccuracy expressed by the S-metric value, for example in nm. By way of example, the reference may be a map of the misregistration values across the wafer, as measured by a different metrology tool or technology. As a further example, the reference may be provided by an algorithm functional to generate a misregistration measurement per site on the wafer.

Additionally or alternatively, the variation of S-metric values across the wafer may be measured under different various metrology tool conditions in order to evaluate conditions having least sensitivity to process variation. For example, S-metric values may be found for metrology landscapes under two different polarizations. The metrology tool condition exhibiting smallest S-metric values or smallest variation of S-metric values may be selected as the optimum metrology tool condition. The metrology tool recipe, for example the optimum wavelength, within the selected optimum condition may then be optimized. Such optimization may be carried out by operation of metrology tool 104 being adjusted based on feedback from scaling metric calculator 106 to metrology tool 104.

Still additionally or alternatively, the S-metric values may be used as a basis for selecting an optimum metrology target for formation on wafer 110 from a range of possible metrology targets. In such a case, S-metric values may be calculated for a range of targets located on wafer 110 and the target design exhibiting least sensitivity to process variation selected as the optimum metrology target. Such target optimization may be carried out, by way of example, based on feedback from, scaling metric calculator 106 to processing tool 102.

Figure 3A:
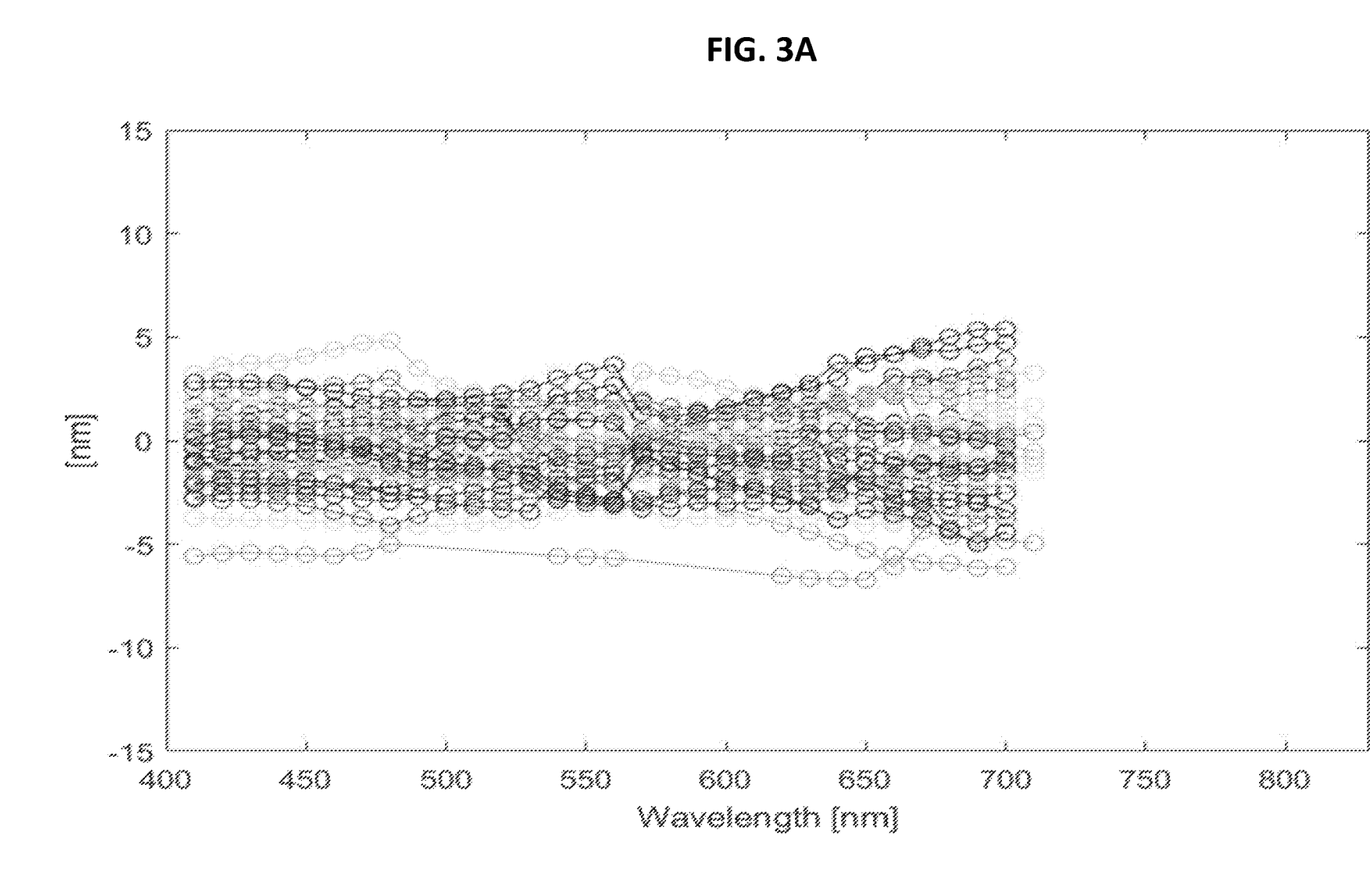
FIGS. 3A and 3B are simplified respective graphs showing additional data obtained from analysis of a metrology landscape as generated by a system of the type shown in FIG. 1.
Figure 3B:
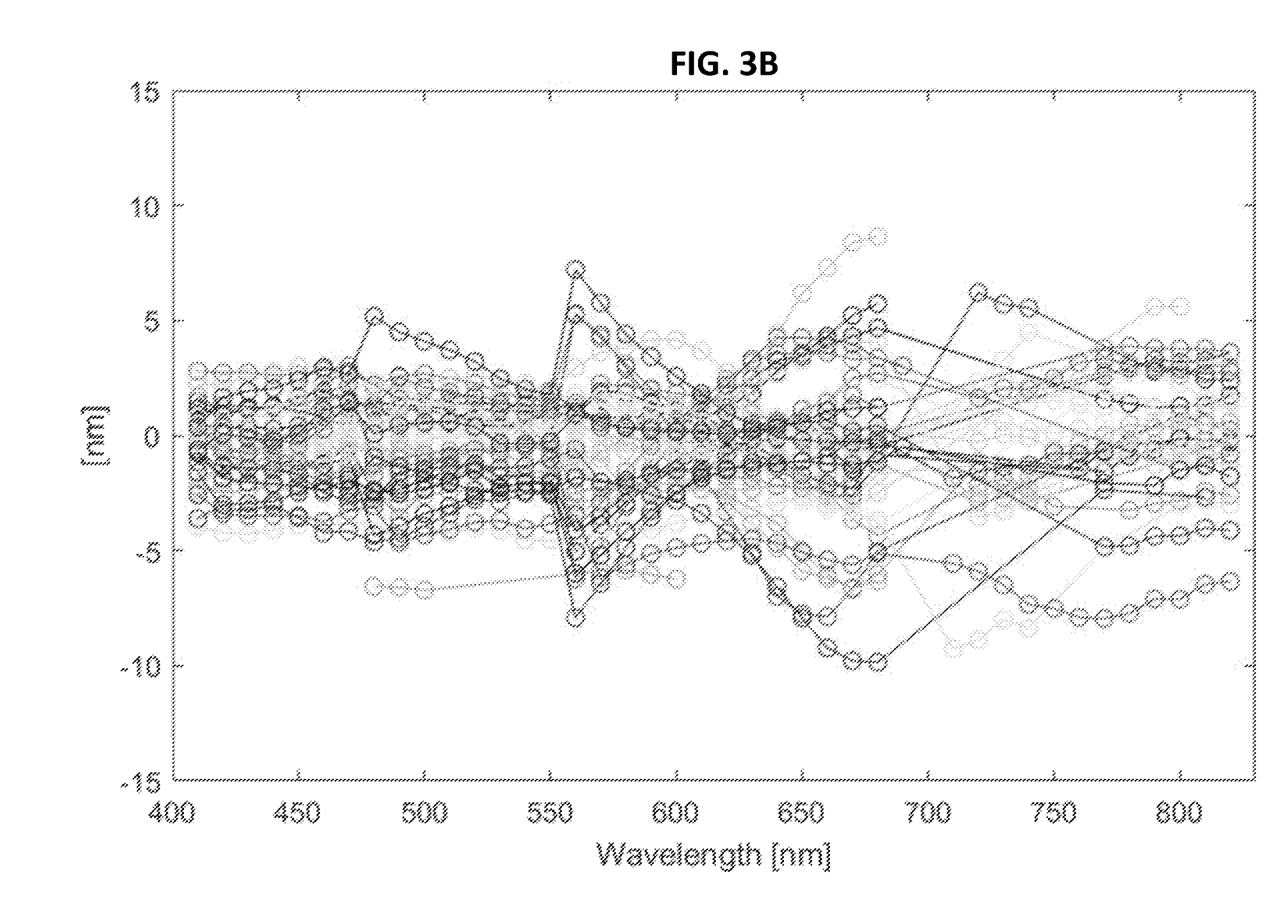

The difference in process variation sensitivity, as quantified by the S-metric, of two different metrology targets may be appreciated from consideration of the metrology landscapes displayed in FIGS. 3A and 3B. Turning now to FIGS. 3A and 3B, the metrology landscapes measured for two different metrology targets located on the same wafer are respectively displayed in FIGS. 3A and 3B. The metrology landscapes of FIGS. 3A and 3B are measured over the same plurality of sites in each case, the metrology landscape per site being indicated by a corresponding line in each of FIGS. 3A and 3B. The 3σ S-metric value for the target of FIG. 3A is equal to 3.4 nm, whereas the 3σ S-metric value for the target of FIG. 3B is equal to 6.7 nm. The target of FIG. 3A is thus the preferable target in comparison to the target of FIG. 3B, due to the lower sensitivity thereof to process variation, as characterized by the S-metric value. Automated computerized algorithms may be employed to automatically select the most accurate, robust target of a variety of metrology targets. Additional techniques, as described hereinabove, may then be used to optimize the metrology recipe and metrology tool settings to reduce process variation induced inaccuracy within the selected target.

Figure 4:
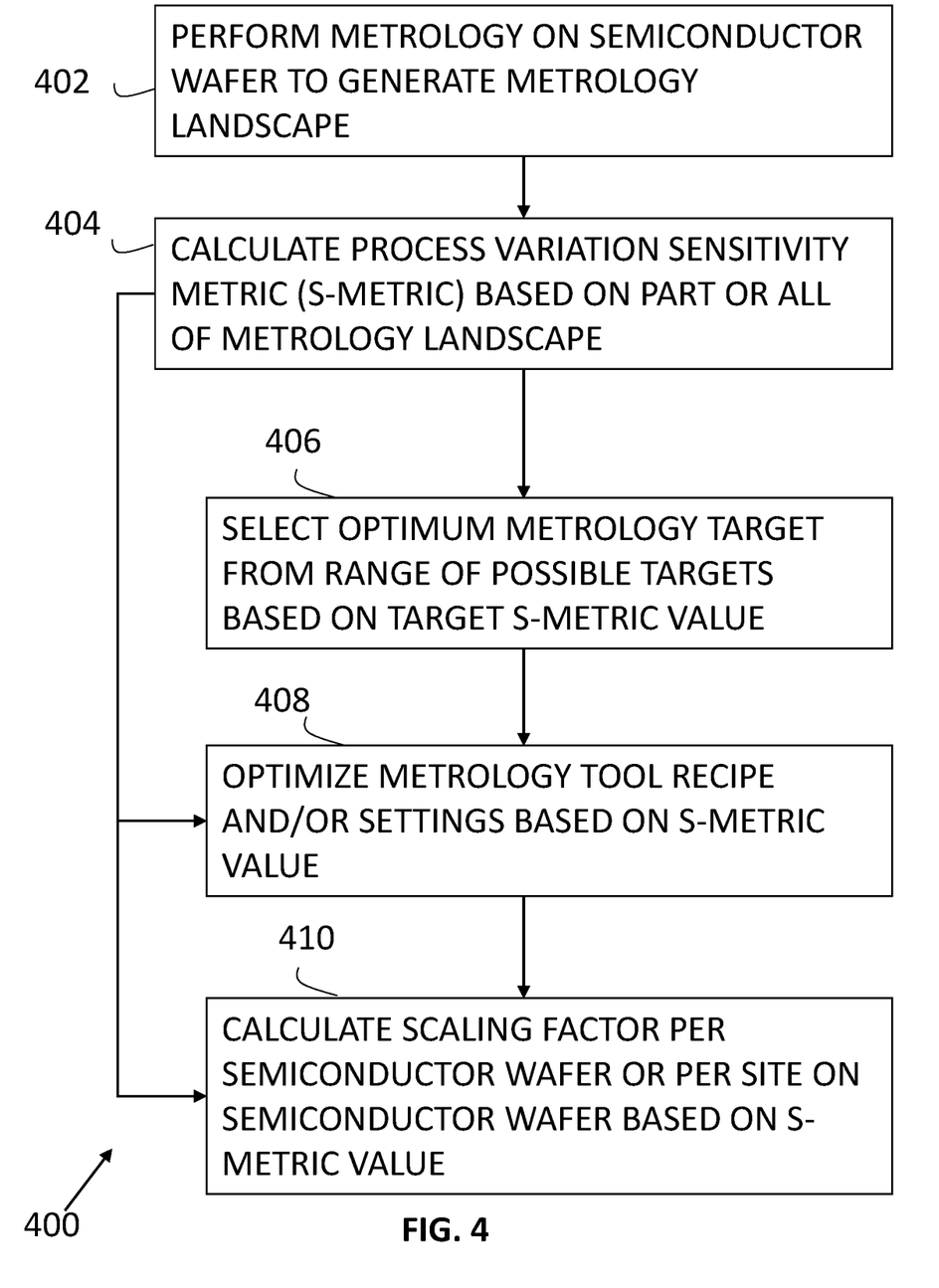
FIG. 4 is a simplified high level flow chart illustrating preferred steps involved in the optimization of metrology as may be performed by a system of the type shown in FIG. 1.

Reference is now made to FIG. 4, which is a simplified high level flow chart illustrating preferred steps involved in the optimization of metrology as may be performed by a system of the type shown in FIG. 1.

As seen in FIG. 4, a method 400 for optimizing metrology based on analysis of metrology landscapes may begin at a first step 402, whereat metrology may be performed on a semiconductor wafer and a metrology landscape may be generated thereby. It is understood that first step 402 may, by way of example be carried out by metrology tool 104 of FIG. 1.

As seen at a second step 404, a process variation sensitivity metric, termed herein the S-metric, may then be calculated. The S-metric is preferably calculated based directly on at least part and possibly all of the metrology landscape generated at first step 402. The S-metric is preferably calculated in accordance with equations (2)-(4) outlined hereinabove.

As seen at a third step 406, a fourth step 408 and a fifth step 410, various metrology optimizations may be carried out based on the S-metric calculated at second step 404. It is appreciated that all of third, fourth and fifth steps 406, 408 and 410 are not necessarily carried out and that the steps are not necessarily performed in the order shown. It is further appreciated that fourth step 408 may be carried out following third step 406 or may be carried out following second step 404; similarly fifth step 410 may be carried out following fourth step 408 following second step 404, following fourth step 408 following third step 406 or directly following second step 404.

As seen at third step 406, an optimum metrology target may be selected from a range of possible metrology targets to be located on the semiconductor wafer, based on the target providing lower S-metric values than other possible targets. Third step 406 may involve measurement of the S-metric value per wafer or per site on the wafer for a variety of possible targets. The target yielding the lowest S-metric value may be selected as that target exhibiting least sensitivity to process variation and thus giving rise to the most accurate metrology measurements, in comparison to other targets.

As seen at fourth step 408, the metrology tool recipe and/or settings may additionally or alternatively be optimized based on the calculated S-metric values. In one embodiment of the preferred method of the present invention, the optimum metrology target may first be selected at third step 406. The metrology tool recipe and/or settings may then be optimized for the selected target. In another embodiment of the preferred method of the present invention, the metrology tool recipe and/or settings may be optimized at fourth step 408 without necessarily selecting an optimum target prior to this step. In either case, the metrology tool recipe may be optimized based on finding the metrology tool landscape parameter associated with the lowest S-metric value and then adjusting the metrology tool so as to operate in accordance with that parameter. By way of example, the metrology tool wavelength correlated with the lowest S-metric value may be found and the metrology tool adjusted to perform metrology at that wavelength, this being the wavelength considered to exhibit least sensitivity to process variations.

As seen at fifth step 410, a scaling factor may additionally or alternatively be calculated per semiconductor wafer or per site on the semiconductor wafer, based on the S-metric value. The scaling factor may correct the misregistration measurements for errors therein due to process variation. Such correction is preferably carried out on the basis of an additional internal or external reference, used to quantify the required correction. It is understood that such scaling is preferably, although not necessarily, performed following selection of an optimum target and an optimum metrology recipe for the selected target, as described with reference to steps 406 and 408.

Figure 5:
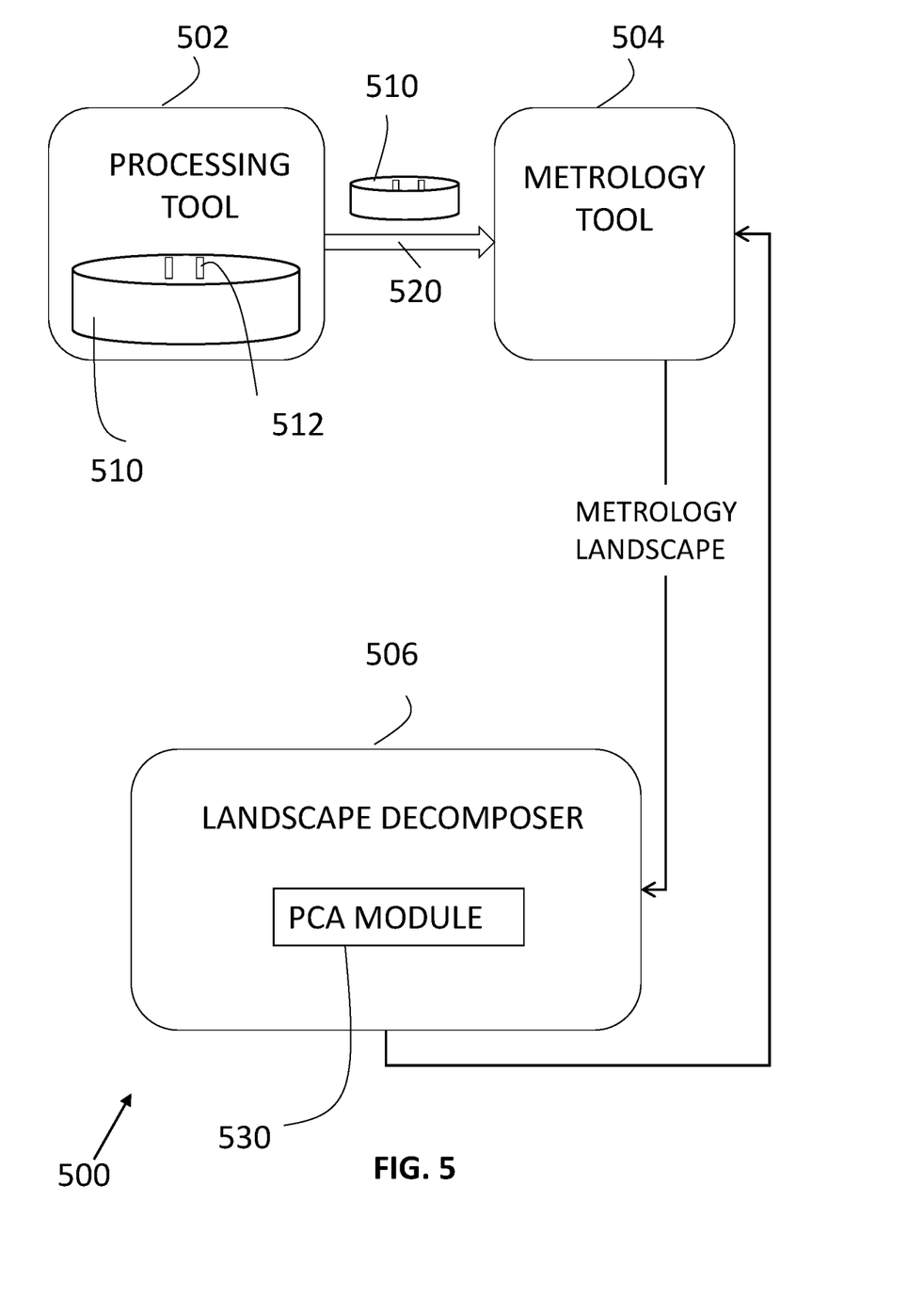
FIG. 5 is a simplified schematic diagram of components of a system for optimization of metrology based on analysis of metrology landscapes, constructed and operative in accordance with another preferred embodiment of the present mention.

Reference is now made to FIG. 5, which is a simplified schematic diagram of components of a system for optimization of metrology based on analysis of metrology landscapes, constructed and operative in accordance with another preferred embodiment of the present invention.

As seen in FIG. 5, there is provided a system 500 for metrology optimization preferably including a semiconductor processing tool 502, a metrology tool 504 and a landscape decomposer 506, for decomposing a metrology landscape generated by metrology tool 504 in order to identify various error components thereof and quantify the contributions of the various identified error components to inaccuracies in the metrology landscape.

Processing tool 502 is preferably operative to process semiconductor wafers, an exemplary one of which semiconductor wafers 510 is shown here. Semiconductor wafer 510 may belong to a lot of semiconductor wafers, which lot may form part of a batch of semiconductor wafers processed by processing tool 502.

Processing tool 502 is preferably embodied as a lithographic patterning tool, such as a scanner. An example of a processing tool useful in the system of FIG. 5 is the ASML scanner 1950*i*, commercially available from ASML of Veldhoven, Netherlands. During processing, semiconductor wafers are preferably retained on a stage of processing tool 502, typically on two chucks thereon.

Metrology tool 504 is preferably embodied as a misregistration measurement tool, for measuring misregistration between layers of semiconductor wafer 510 produced by sequential processing steps carried out by processing tool 502. Metrology tool is particularly preferably operative to measure misregistration between targets located on layers of semiconductor wafer 510, misregistration between the targets being considered to be indicative of misregistration between the layers themselves upon which the targets are located. A metrology target 512 located on wafer 510 is shown in a highly schematic, representative manner in FIG. 5.

In accordance with one particularly preferred embodiment of the present invention, the design of metrology target 512 is selected in accordance with an optimum metrology target design having a minimum S-metric value, as described hereinabove with reference to FIGS. 1-4. In this embodiment of the present invention, system 100 of FIG. 1 is initially operative to find the optimum target design having minimal sensitivity to process variation, as quantified by the S-metric, calculation of which is described hereinabove. The optimum target design 512 is then formed on wafer 510 and metrology performed thereon by metrology tool 504. It is appreciated that in such an embodiment, the functionality of system 100 shown in FIG. 1 may be combined with the functionality of system 500 shown in FIG. 5, the two systems being distinguished between herein only for the sake of clarity of the description of each one.

Alternatively, the design of metrology target 512 may be selected without prior optimization thereof based on the S-metric, in accordance with metrology selection criteria other than the S-metric.

Irrespective of the basis upon which the design of metrology target 512 is selected, metrology tool 504 is preferably operative to output a metrology spectrum or landscape, recording the dependency of one or more metrology measurements, such as misregistration, on one of more metrology parameters, such as measurement wavelength. It is appreciated that although the metrology landscape output by metrology tool 504 is described henceforth as a misregistration landscape varying as a function of wavelength, this is illustrative only and other metrology landscapes charting metrology measurements other than misregistration as a function of metrology parameters other than wavelength are also possible and included in the scope of the present invention.

Metrology tool 504 may be any type of optical metrology tool, including an imaging, type tool or a scatterometry type tool. An example of a metrology tool useful in the system of FIG. 5 is the Archer ATL100, commercially available from KLA of Calif., USA. Processing tool 502 and metrology tool 504 are preferably located at a common location such that semiconductor wafer 510 processed by processing tool 502 may be readily transferred to metrology tool 504 for the performance of metrology thereon. The physical transfer of semiconductor wafer 510 between processing tool 502 and metrology tool 504 is indicated in FIG. 5 by an arrow 520.

The metrology landscape generated by metrology tool 504 is typically influenced by both systematic and non-systematic effects present within system 500, causing inaccuracies in the metrology landscape. Systemic inaccuracy effects within system 500 may include errors due to asymmetry of metrology target 512 and errors due to process variation in the processing carried out by processing tool 502. Non-systematic inaccuracy effects within system 500 may include errors arising from various sources of noise in system 500, including noise relating to target 512, random noise, and noise relating to the metrology methodology itself. These systematic and non-systematic effects contribute to the measured landscape, such that the measured landscape includes both measurement of the actual misregistration between layers of semiconductor wafer 510 as a function of wavelength, as well as error components due to systematic and non-systematic effects.

It is a purpose of the present invention, in one aspect thereof, to provide a novel method for decomposing the metrology landscape generated by metrology tool 504 into the various components thereof, including components arising from systematic and non-systematic effects. The contribution of these effects to the measured landscape may then be quantified, thereby allowing correction of the measured landscape for these effects. As a result, the accuracy of the misregistration measurements obtained by metrology tool 504 may be improved.

The metrology landscape output by metrology tool 504 is preferably provided to landscape decomposer 506. Landscape decomposer 506 preferably includes a Principle Component Analysis (PCA) module 530. PCA module 530 is preferably operative to receive the metrology landscape generated by metrology tool 504 and to perform PCA in order to decompose the landscape into signature components associated with systematic and non-systematic effects. PCA module 530 is additionally preferably operative to quantify the contribution of the components arising from systematic and non-systematic effects to the measured misregistration, thereby allowing correction of the measured misregistration for these effects.

It is appreciated that although landscape decomposer 506 is illustrated herein as a separate module, distinct from metrology tool 504, this is for the purpose of clarity of explanation only and the functionality of landscape decomposer 506 may alternatively be fully or partially incorporated within metrology tool 504. Landscape decomposer is preferably operative to, provide feedback to metrology tool 504 based on the decomposition carried out thereby, as is further detailed below. PCA module 530 forming part of landscape decomposer 506 is preferably a computerized module, including computerized code that, when executed, performs the various steps described hereinbelow with reference to FIGS. 6 and 7.

Figure 6:
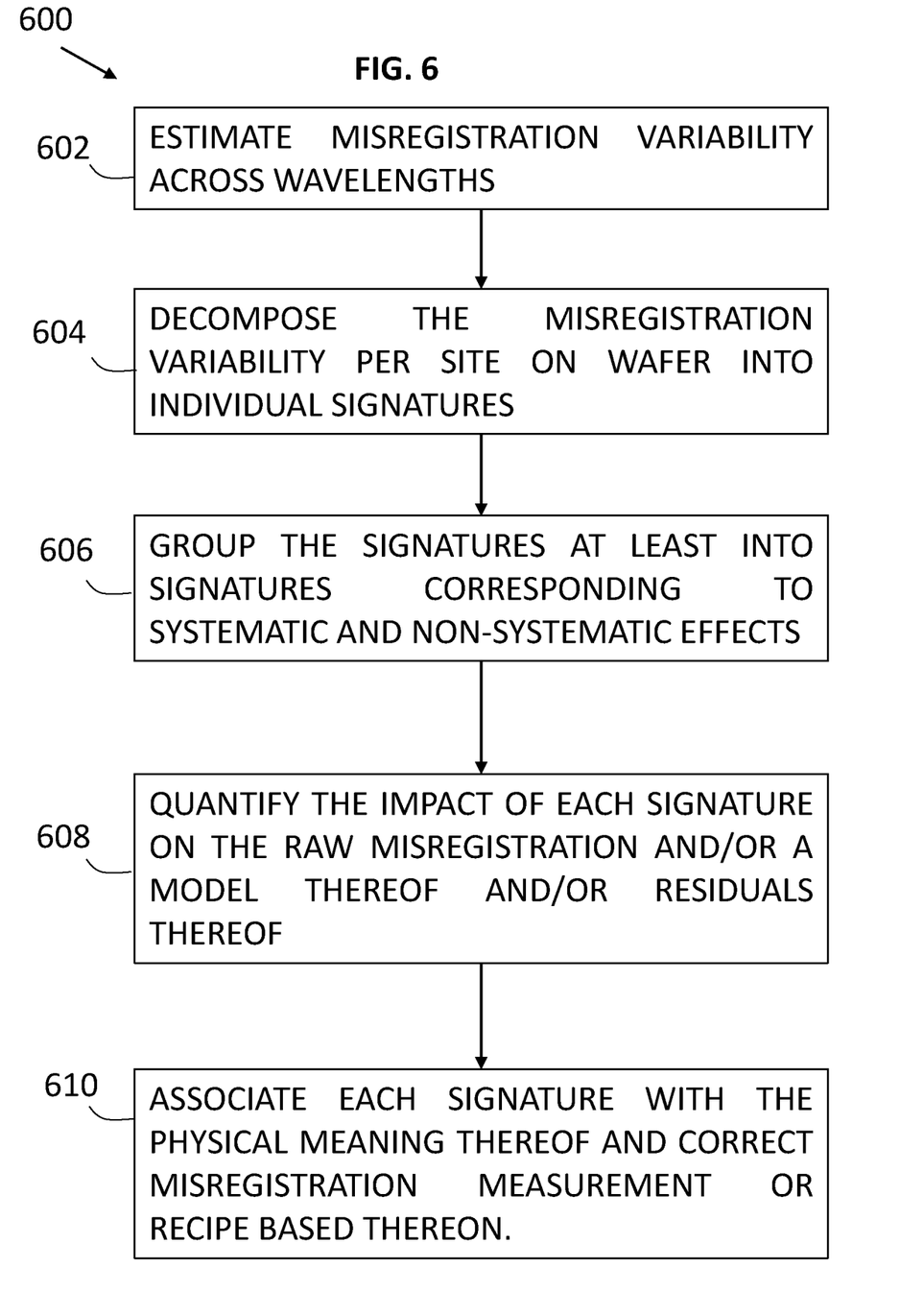
FIG. 6 is a simplified high level flow chart illustrating preferred steps involved in decomposition of a metrology landscape as performed by a system of the type shown in FIG. 5.

A preferred mode of operation of PCA module 530 is illustrated in FIG. 6. As seen in a flow chart 600 in FIG. 6, at a first step 602 the variability of misregistration across the range of wavelengths at which the misregistration is measured is found. This variability of the misregistration with wavelength may be considered to correspond to the inaccuracy of the misregistration measurements.

As seen at a second step 604, the inaccuracy or variability in misregistration is preferably decomposed into individual signatures per site, each of which individual signatures represents a particular effect, either systematic or non-systematic, on the measured misregistration. The decomposition is preferably carried out using PCA, where each principle component corresponds to a signature. The decomposition may be performed on one or more of three levels: raw inaccuracy, modeled inaccuracy and residuals.

In imaging type metrology, the PCA decomposition may be performed at an optimal pooled focus between current and previous layers of the semiconductor wafer by building a landscape signature across the various imaging wavelengths. Alternatively, the PCA decomposition may be performed at an optimum focus per layer, by building a separate landscape signature per wavelenght. Alternatively, the PCA decomposition may be performed by building a landscape signature through focus and through wavelength and decomposing the landscape signature in 3D. Alternatively, the PCA analysis may be performed across the wavelengths for each focus, wherein the focus may be a per layer focus or pooled focus. The PCA decomposition may be performed on the kernel itself, the kernel being the raw signal from which the misregistration is extracted, or on the kernel across the wavelengths.

In scattering type metrology, the PCA decomposition may be performed at a landscape level, at a pupil level or at both landscape and pupil levels.

As seen at a third step 606, the signatures detected at step 604 are preferably grouped into signatures corresponding to systematic and non-systematic effects. Distinguishing between signatures as corresponding to systematic or non-systematic effects may be based on any appropriate criteria. For example each principle component may be modelled across the wafer and the raw signature correlated to the residual signature. In the case of a high correlation, the principle component may be considered as non-systematic and in the case of a low correlation, the principle component may be considered as systematic. Additionally or alternatively, the percentage of explained variation per principle component may be examined. In the case of a high percentage of explained variation, e.g. 50% or greater, the principle component may be considered to be systematic and in the case of a lower percentage of explained variation e.g. less than 50%, the principle component may be considered to be non-systematic. Additionally or alternatively, the difference in variation between the raw signature of the principle component and the residuals signature of the same principle component may be found. In the case that the difference in variation is above a given threshold, the principle component may be considered non-systematic Whereas if the difference in variation in below the given threshold, the principle component may be considered systematic.

Figure 7:
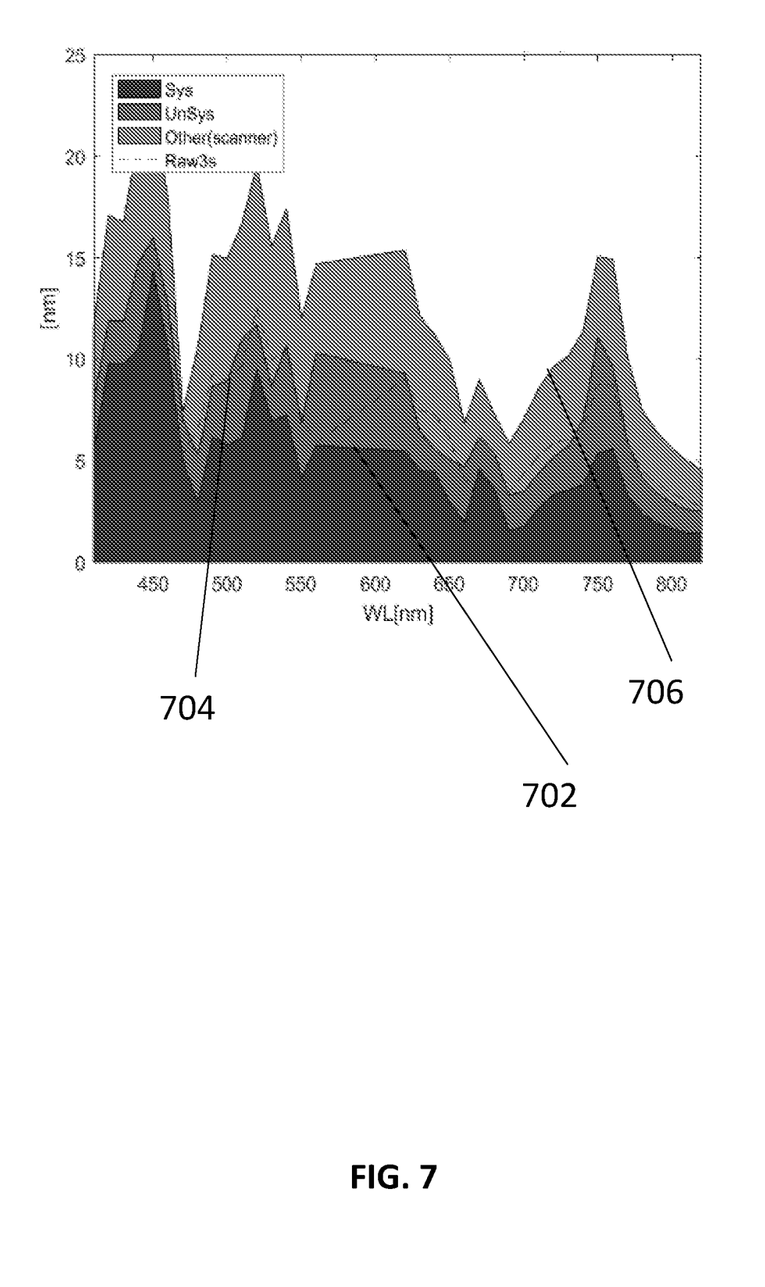
FIG. 7 is a simplified graph showing a metrology landscape decomposed into various components thereof as generated by a system of the type shown in FIG. 5 in accordance with the steps shown in FIG. 6.

As seen at a fourth step 608, the impact of each signature or principle component may then be quantified. The impact of the signature may be quantified in terms of the raw misregistration variation, a model thereof or residuals thereof. An example of a breakdown of the raw misregistration variation into systematic, non-systematic and other effects is shown in FIG. 7. The decomposed metrology landscape shown in FIG. 7 may be output by landscape decomposer 506 (FIG. 5). As seen in FIG. 7, the landscape may be decomposed into systematic components, as indicated by a first plot 702, non-systematic components, as indicated by a second plot 704, and other components as indicated by a third plot 706. As appreciated from consideration of FIG. 7, minimum inaccuracy is seen towards higher metrology wavelengths. Based on this, the metrology recipe performed by metrology tool 504 (FIG. 5) may be optimized by selecting wavelengths exhibiting greatest measurement accuracy. Furthermore, based on the decomposed components shown in FIG. 7, the metrology landscape output by metrology tool 504 (FIG. 5) may be calibrated to remove inaccuracy components therefrom. Systematic, non-systematic or both effects may be removed.

As seen at a fifth step 610, each signature or principle component is preferably associated with the physical meaning thereof. For example, in the case of an asymmetry in the target, one principle component may indicate a sidewall angle of 1 degree in a bar forming part of the target in the current layer. Another principle component may indicate a sidewall angle of 2 degrees in a bar forming part of the target in the previous layer. A third principle component may indicate a tilt in a top bar of the target. Following the identification of the different possible physical effects at, step 610, these effects may be corrected or compensated for.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A method for quantifying sensitivity of metrology to process variation comprising:
performing metrology, by a metrology tool, on at least a plurality of metrology targets located at at least one site on a semiconductor wafer, thereby generating a metrology landscape; and
calculating a sensitivity metric directly based on said metrology landscape, said sensitivity metric quantifying a sensitivity of said metrology landscape to process variation involved in manufacture of said semiconductor wafer, wherein said calculating a sensitivity metric comprises calculating a sensitivity metric for each of said plurality of metrology targets;
comparing said sensitivity metrics calculated for each of said plurality of metrology targets;
selecting a selected metrology target of said plurality of metrology targets as an optimum metrology target having least sensitivity to said process variation in comparison to other ones of said plurality of metrology targets, based on a value of said sensitivity metric of said selected metrology target being lower than values of said sensitivity metric of said other ones of said plurality of metrology targets; and following said selecting a selected metrology target:
further performing metrology on said semiconductor wafer by said metrology tool, utilizing said selected metrology target, thereby generating an additional metrology landscape;
decomposing said additional metrology landscape at least into components thereof arising from systematic and non-systematic errors therein;
quantifying a contribution of at least one of said components to said additional metrology landscape; and
correcting said additional metrology landscape by removing therefrom said contribution, as found by said quantifying.

2. The method according to claim 1, and also comprising correcting said metrology landscape for errors therein arising from said process variation, based on a value of said sensitivity metric.

3. The method according to claim 1, wherein said performing metrology comprises performing metrology over a multiplicity of wavelengths, said metrology landscape measuring variation of a metrology measurement as a function of said multiplicity of wavelengths.

4. The method according to claim 3, wherein said metrology measurement comprises measurement of misregistration between layers of said semiconductor wafer.

5. The method according to claim 4, and also comprising:
selecting an optimum wavelength of said multiplicity of wavelengths having least sensitivity to process variation in comparison to other wavelengths of said multiplicity of wavelengths, based on correlating values of said sensitivity metric to ones of said multiplicity of wavelengths, and
further performing metrology on said semiconductor wafer by said metrology tool, utilizing said optimum wavelength.

6. The method according to claim 3, wherein said sensitivity metric is calculated in accordance with $$S_{metric} = \chi \cdot \sqrt{\frac{\sum_{i=1}^{N} w_i(MIS_i - <MIS>)^2}{\sum w_i}}$$

wherein $S_{metric}$ is said sensitivity metric, N is a number of said multiplicity of wavelengths over which a part of interest of said metrology landscape is measured, i is a wavelength index, $MIS_i$ is a misregistration measurement at wavelength i of said multiplicity of wavelengths N, $w_i$ is a wavelength weight, and $<MIS>$ is a weighted average misregistration across said landscape, given by $$<MIS> = \frac{\sum w_i MIS_i}{\sum w_i}$$

and x takes a value of +1 or −1.

7. The method according to claim 1, and also comprising performing said metrology under a plurality of conditions, calculating said sensitivity metric for each of said plurality of conditions and optimizing said performance of said metrology in accordance with a condition of said plurality of conditions having a lowest sensitivity metric value calculated therefor.

8. A system for quantifying sensitivity of metrology to process variation comprising:

a metrology tool operative to perform metrology on at least one metrology target located at at least one site on a semiconductor wafer, said metrology tool generating a metrology landscape, wherein said metrology tool is operative to perform said metrology over a multiplicity of wavelengths, said metrology landscape measuring variation of a metrology measurement as a function of said multiplicity of wavelengths, and to select an optimum wavelength of said multiplicity of wavelengths having least sensitivity to process variation in comparison to other wavelengths of said multiplicity of wavelengths, based on correlating values of said sensitivity metric to ones of said multiplicity of wavelengths, said metrology tool being operative to perform additional metrology on said semiconductor wafer, utilizing said optimum wavelength, thereby generating an additional metrology landscape;

a sensitivity metric calculator operative to receive said metrology landscape and to calculate a sensitivity metric directly based on said metrology landscape, said sensitivity metric quantifying a sensitivity of said metrology landscape to process variation involved in manufacture of said semiconductor wafer; and a landscape decomposer operative to decompose said additional metrology landscape at least into components thereof arising from systematic and non-systematic errors therein, quantify a contribution of at least one of said components to said additional metrology landscape, and correct said additional metrology landscape by removing therefrom said contribution.

9. The system according to claim 8, wherein said metrology tool is operative to perform said metrology on a plurality of metrology targets and said sensitivity metric calculator is operative to calculate a sensitivity metric for each of said plurality of metrology targets,
said sensitivity metric calculator being additionally operative to compare said sensitivity metrics calculated for each of said plurality of metrology targets and to select a selected metrology target of said plurality of metrology targets as an optimum metrology target having least sensitivity to said process variation in comparison to other ones of said plurality of metrology targets, based on a value of said sensitivity metric of said selected metrology target being lower than values of said sensitivity metric of said other ones of said plurality of metrology targets.

10. The system according to claim 8, wherein said metrology tool is operative to perform said metrology under a plurality of conditions, and said sensitivity metric calculator is operative to calculate said sensitivity metric for each of said plurality of conditions, performance of said metrology being optimized in accordance with a condition of said plurality of conditions having a lowest sensitivity metric value calculated therefor.

11. The system according to claim 8, wherein said sensitivity metric is calculated in accordance with $$S_{metric} = \chi \cdot \sqrt{\frac{\sum_{i=1}^{N} w_i(MIS_i - <MIS>)^2}{\sum w_i}}$$

wherein $S_{metric}$ is said sensitivity metric, N is a number of said multiplicity of wavelengths over which a part of interest of said metrology landscape is measured, i is a wavelength index, $MIS_i$ is a misregistration measurement at wavelength i of said multiplicity of wavelengths N, $w_i$ is a wavelength weight, and <MIS> is a weighted average misregistration across said landscape, given by $$<MIS> = \frac{\sum w_i MIS_i}{\sum w_i}$$

and x takes a value of +1 or −1.

12. A system for quantifying components of metrology, comprising:
   a metrology tool operative to perform metrology on a semiconductor wafer and to output a metrology landscape; and
   a landscape decomposer operative to decompose said metrology landscape at least into components thereof arising from systematic and non-systematic errors, to quantify a contribution of at least one of said components to said metrology landscape and to correct said metrology landscape by removing therefrom said contribution.

13. The system according to claim 12, wherein said landscape decomposer is operative to perform principle component analysis on said metrology landscape in order to decompose said metrology landscape into said components thereof.

14. The system according to claim 12, wherein said landscape decomposer is operative to decompose said metrology landscape on at least one of a raw inaccuracy level, a modelled inaccuracy level and a residual inaccuracy level.

15. The system according to claim 12, and also comprising a sensitivity metric calculator operative to receive said metrology landscape and to calculate a sensitivity metric directly based on said metrology landscape, said sensitivity metric quantifying a sensitivity of said metrology landscape to process variation involved in manufacture of said semiconductor wafer.

\* \* \* \* \*